TRANSISTOR GATING CIRCUIT FOR TRIGGERABLE DEVICE

Filed June 22, 1964

WILLIAM J. STEVENS JR.
INVENTOR.

BY

BUCKHORN, BLORE, KLARQUIST & SPARKMAN
ATTORNEYS 3,277,319

TRANSISTOR GATING CIRCUIT FOR TRIGGERABLE DEVICE

William J. Stevens, Jr., Beaverton, Oreg., assignor to Tektronix, Inc., Beaverton, Oreg., a corporation of Oregon Filed June 22, 1964, Ser. No. 376,660
1 Claim. (Cl. 307—88.5)

Figures 1, 2:
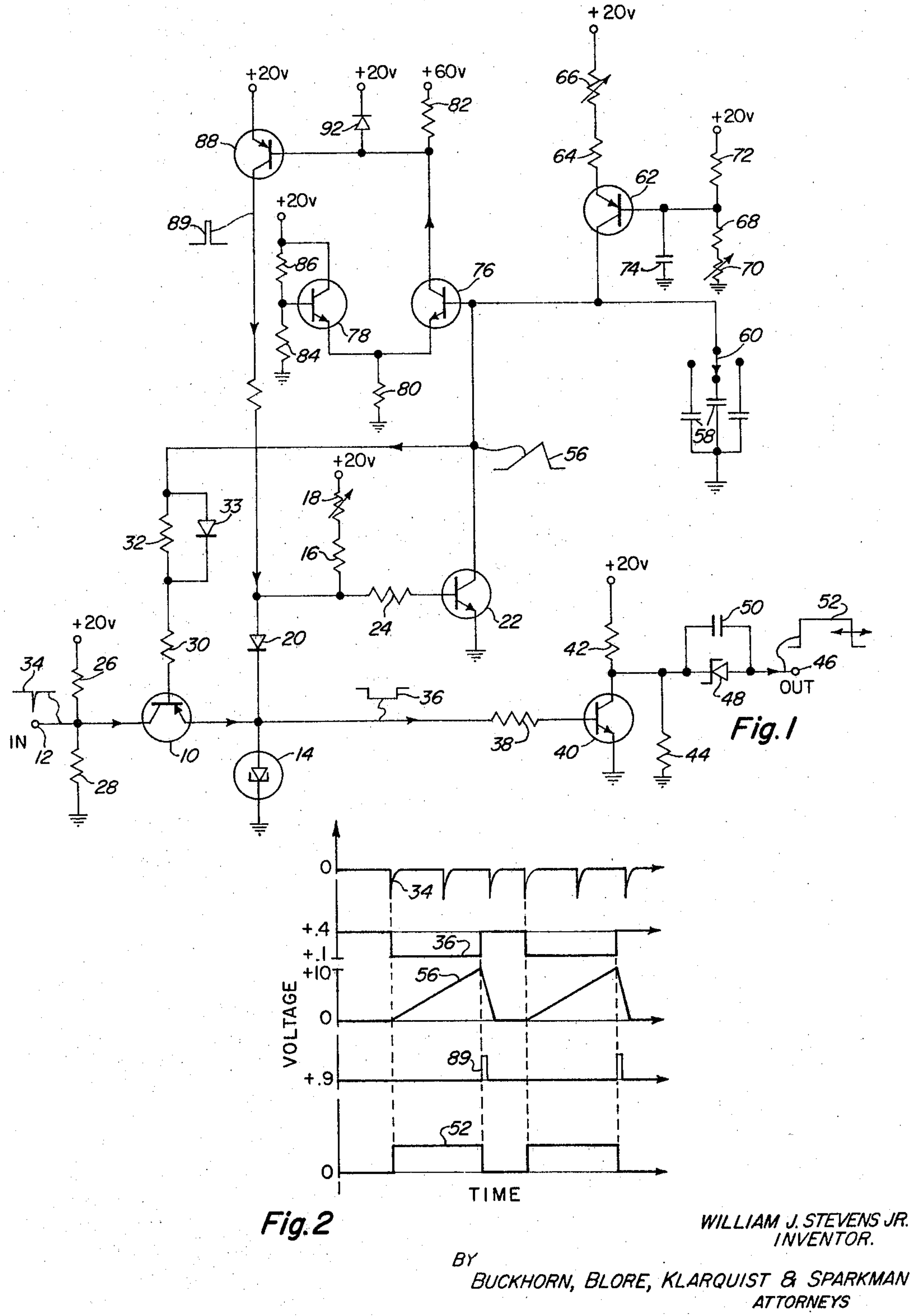

The subject matter of the present invention relates generally to electrical signal gating circuits, and in particular to transistor gating circuits for triggerable devices, such as tunnel diodes.

Briefly, one embodiment of the present gating circuit includes a transistor which is normally biased so as to be in a saturated conducting state and the collector of such transistor is connected to an input terminal in order that input trigger pulses applied to such collector drive the transistor momentarily into its active conducting state and appear as output pulses at the emitter of such transistor. The output pulses of the gating transistor are transmitted to a tunnel diode connected as a bistable multivibrator to trigger such tunnel diode to a low voltage state which immediately renders such transistor nonconducting. A disabling ramp voltage or hold-off signal is applied to the base of the gating transistor after the tunnel diode is triggered, to hold such transistor in a nonconducting state to prevent the transmission of subsequent trigger pulses therethrough until after the hold-off signal causes a voltage comparator circuit to revert the tunnel diode and such hold-off signal returns to its quiescent level to render the gating transistor again conducting.

The transistor gating circuit of the present invention is especially useful when employed in a pulse generator circuit to control the triggering of a tunnel diode so that output pulses are produced in response to input trigger pulses applied to the collector of the gating transistor and to vary the width of such output pulses by changing the slope of the disabling signal applied to the base of such gating transistor. However, the present transistor gating circuit can be employed to control any low impedance current sensitive triggerable device in other types of circuits.

The gating circuit of the present invention has several advantages over conventional gating circuits including a lower D.C. bias power requirement. Since the transistor gate is normally biased in a saturated conducting state it may be employed with input trigger pulses of less amplitude, because substantially all of the trigger pulse current is transmitted through the transistor to the device being triggered. Also the gating circuit of the present invention is of simple and inexpensive construction because it employs few circuit components. In addition, the present transistor gating circuit requires less hold-off or disabling signal voltage so that such signal may be applied directly to the base of a transistor from the hold-off capacitor signal forming network without additional amplification. Furthermore, even though the transistor is biased in a saturated conducting state, it still may be employed to trigger devices at a high frequency up to several megacycles per second because such transistor is rendered non-conducting immediately after triggering, by the disabling signal to reduce current carrier storage.

Therefore, one object of the present invention is to provide an improved gating circuit of simple and inexpensive construction.

Another object of the invention is to provide an improved transistor gating circuit of fast and efficient operation in which the transistor is normally biased in a saturated conducting state and input trigger pulses are applied to the collector of the transistor while a disabling signal is applied to the base of such transistor to determine when such trigger pulses are transmitted to the emitter of the transistor as output pulses.

Still another object of the invention is to provide an improved transistor gating circuit for triggerable devices which can be operated by input trigger pulses of extremely low current and requires less stand by bias power.

A further object of the invention is to provide an improved pulse generator circuit for producing output pulses at precisely known times, in which a gating transistor normally biased in a saturated conducting state is employed to control the transmission of input trigger pulses applied to the collector of the transistor through such transistor to a triggerable device connected to the emitter of the transistor, and a disabling signal is applied directly to the base of the gating transistor to render it nonconducting immediately after such device is triggered.

An additional object of the present invention is to provide an improved transistor gating circuit for controlling the triggering of a tunnel diode multivibrator which transmits trigger pulses with very little attenuation.

A still further object of the present invention is to provide an improved pulse generator circuit for producing high frequency output pulses of variable width.

Additional objects and advantages of the present invention will be apparent from the following detailed description of a preferred embodiment thereof and from the attached drawings, of which:

FIG. 1 is a schematic diagram of a pulse generator circuit employing the transistor gating circuit of the present invention; and FIG. 2 shows the wave forms of signals applied to and produced by the circuit of FIG. 1 in time relation to one another.

The pulse generator circuit of FIG. 1 includes a gating transistor 10 which may be a PNP type junction transistor having its collector connected to an input terminal 12 and its emitter connected as an output to the anode of a tunnel diode 14 whose cathode is connected to ground. The anode of the tunnel diode is connected to a source of positive D.C. bias voltage of +20 volts through a fixed load resistor 16 of 2 kilohms in series with a variable load resistor 18 of 5 kilohms which sets the D.C. bias current flowing through such tunnel diode. The tunnel diode 14 is connected as a bistable multivibrator and normally is biased in a high voltage stable state by the setting of resistor 18 to apply a bias voltage of about +.4 volt to the emitter of transistor 10. A silicon rectifier 20 is connected between resistor 16 and the tunnel diode 14 in the proper polarity to transmit the positive bias current, in order to increase the D.C. voltage applied to the base of an inverter amplifier switching transistor 22 of NPN type silicon through a coupling resistor 24 of 10 ohms so that such switching transistor is normally biased in a conducting state by the voltage drop across diodes 14 and 20. A pair of voltage divider resistors 26 and 28 of 68 kilohms and 1 kilohm, respectively, are connected in series between a source of positive D.C. bias voltage of +20 volts and ground so that a bias voltage of about +.3 volt is produced across resistor 28 and applied to the collector of gating transistor 10. Since the switching transistor 22 is normally biased conducting and the emitter of such switching transistor is connected to ground, the normal bias voltage applied to the base of gating transistor 10 is approximately zero volts because such base electrode is connected through a pair of series coupling resistors 30 and 32 of 510 ohms and 2 kilohms, respectively, to the collector of such switching transistor. A bypass diode 33 is connected across coupling resistor 32 with a polarity to transmit positive voltage signals around such resistor for reasons hereafter described. Thus, the collector junction of the gating transistor 10 is forward biased by approximately +.3 volt while the emitter junction of such transistor is forward biased by about +.4 volt, so that the gating transistor is normally biased in a saturated conducting state.

Since the gating transistor 10 is normally biased in a saturated state, substantially all of the current of a negative input trigger pulse 34 applied to input terminal 12 is transmitted from the collector to the emitter of such gating transistor and applied to the anode of tunnel diode 14 without any appreciable attenuation. The first input pulse transmitted through the gating transistor triggers such tunnel diode to a low voltage stable state of about +.1 volt. This produces a negative going voltage 36 on the anode of the tunnel diode which is transmitted through a coupling resistor 38 of 10 ohms to the base of an inverter amplifier output transistor 40. The output transistor 40 may be a germanium transistor of an NPN type whose emitter is connected to ground and which is normally biased conducting by the voltage drop across tunnel diode 14 so such transistor is rendered nonconducting by the negative voltage 36. The collector of output transistor 40 is connected to a source of positive D.C. supply voltage of +20 volts through a load resistor 42 of 1 kilohm. Load resistor 42 forms a voltage divider with a resistor 44 of 1 kilohm connected between the collector of the output transistor and ground. The collector of output transistor 40 is connected to an output terminal 46 through a zener diode 48 having a breakdown voltage of about 7.2 volts which is shunted by a capacitor 50 of .01 microfarad. The zener diode 48 functions as a voltage dropping device to maintain the D.C. voltage level of output terminal 46 at zero volts while the bypass capacitor 50 shunts high frequency signals around such zener diode. Thus, when the output transistor 48 is rendered nonconducting by the negative voltage 36, a positive going output voltage pulse 52 is transmitted to output terminal 46.

When the negative input trigger pulse 34 is applied to the collector of the PNP gating transistor 10, it tends to reverse bias the collector junction of the transistor and drive such transistor out of its saturated state into an active conducting state. However, as soon as tunnel diode 14 is triggered to its low voltage state, the negative voltage 36 is applied to the base of switching transistor 22 and renders such switching transistor nonconducting so that the voltage on the collector of the switching transistor immediately starts positive producing a ramp-shaped disabling signal 56 in a manner hereafater described. The positive voltage disabling signal is applied directly to the base of the gating transistor to reverse bias the emitter junction of such gating transistor and render it nonconducting immediately, due to the fact that the voltage drop across the triggered tunnel diode and applied as a forward bias voltage to the emitter of the gating transistor is only about +.1 volt. The bypass diode 33 shunts the positive going leading edge of the disabling signal around coupling resistor 32 to cause the gating transistor to be switched "off" at a lower voltage on such leading edge.

The disabling and hold-off signal 56 is produced by current flowing through one of a plurality of different timing capacitors 58 having one terminal grounded and the other terminal connected to a source of substantially constant current by a selector switch 60, when switching transistor 22 is rendered nonconducting. The value of the selected timing or hold-off capacitor 58 determines the slope of the disabling signal which sets the time that the tunnel diode 14 is reverted thereby controlling the width of the output pulse 52, as well as the length of time the gating transistor 10 is rendered nonconducting to "hold-off" or prevent such tunnel diode from being retriggered. The constant current generator may be a transistor 62 of the PNP type having its emitter connected to a source of positive D.C. bias voltage of +20 volts through a fixed resistor 64 of 200 ohms in series with a variable resistor 66 of 1 kilohm for controlling the amount of charging current supplied to the hold-off capacitor connected to the collector of such transistor. The base of transistor 62 is connected to a D.C. reference voltage across a fixed resistor 68 of 5.1 kilohms and a variable resistor 70 of 5 kilohms which form a voltage divider with a resistor 72 of 5.6 kilohms, that is connected between a source of positive D.C. reference voltage of +20 volts and ground, so that the setting of resistor 70 controls the value of such reference voltage. A bypass capacitor 74 of .01 microfarad is connected between the base of transistor 62 and ground across resistors 68 and 70. The charging current flowing through transistor 62 is normally shunted around the hold-off capacitors to ground through switching transistor 22 because such switching transistor is normally biased conducting. However, when the negative voltage 36 renders switching transistor 22 nonconducting, this charging current then flows into the hold-off capacitor connected by selector switch 60 to the collector of transistor 62 and causes the production of the ramp shaped voltage of the hold-off or disabling signal 56. As stated above, the disabling signal renders gating transistor 10 nonconducting and prevents further trigger signals from being transmitted through such gating transistor to tunnel diode 14 until the gating transistor is again rendered conducting.

The disabling signal 56 is also applied to the base of a first comparator transistor 76 of the NPN type whose emitter is connected in common with the emitter of a second comparator transistor 78, also of the NPN type, and these emitters are both connected to ground through a common bias resistor 80 of 2.7 kilohms. The collector of the first comparator transistor 76 is connected to a source of positive D.C. bias voltage of +60 volts through a load resistor 82 of 20 kilohms, while the collector of the second comparator transistor 78 is connected to a source of positive D.C. voltage of +20 volts. The base of the second comparator transistor is connected across a bias resistor 84 of 5.9 kilohms connected in series with a resistor 86 of 8.2 kilohms which is connected in parallel with the collector junction of such transistor to form a voltage divider between a source of D.C. bias voltage of +20 volts and ground, so that a reference voltage of about +10 volts is applied to the base of transistor 78. Thus, comparator transistor 78 is normally biased conducting, while the first comparator transistor 76 is normally biased nonconducting because its base bias voltage is approximately zero volts. When the leading edge of the ramp voltage wave form of the disabling signal 56 increases to approximately +10 volts, the conductive condition of the comparator transistors is reversed and transistor 76 is rendered conducting. This causes a negative going voltage signal to be produced on the collector of transistor 76 and applied to the base of an inverter amplifier transistor 88 connected thereto.

The inverter transistor 88 is of a PNP type with its emitter connected to a positive D.C. bias voltage of +20 volts and its collector is connected through a coupling resistor of 2 kilohms and diode 20 to the anode of tunnel diode 14. The base of the inverter transistor is connected through a voltage limiting diode 92 to a source of positive D.C. bias voltage of +20 volts so that current flow through resistor 82 and such diode produces a voltage of about +20.5 volts on the base of such inverter transistor to render it normally nonconducting. Thus, the negative voltage signal applied to the base of the inverter transistor 88 causes such inverter transistor to become conducting to transmit a positive going voltage pulse 89 to the anode of tunnel diode 14 which reverts such tunnel diode to its initial high voltage stable state. As a result of the increase in voltage on the anode of the tunnel diode, the output transistor is again rendered conducting and the output pulse 52 terminates. The reverting voltage pulse 89 is also applied to the base of switching transistor 22 to render such switching transistor conducting. As a result, the hold-off capacitor connected to the movable contact of switch 60 begins discharging through the switching transistor to produce the negative trailing edge or hold-off portion of the disabling signal 56. Since the gating transistor 10 is held in a nonconducting condition by the disabling signal 56 until the trailing edge of such disabling signal reaches about zero volts, the tunnel diode 14 is "held off" to prevent input trigger pulses from triggering such tunnel diode after it is reverted, until after the hold-off capacitor has completely discharged. Comparator transistors 76 and 78 are immediately rendered nonconducting and conducting, respectively, as soon as the ramp voltage of the disabling signal falls below about +10 volts and this also causes transistor 88 to be rendered nonconducting to terminate the reverting pulse 89.

It should be noted that the hold-off or disabling signal 56 is applied directly to the base of gating transistor 10 without employing an additional amplification stage between the hold-off capacitor and such transistor. This is possible because the initial portion of the leading edge of the hold-off signal immediately reversely biases the emitter junction of the gating transistor 10, due to the extremely low positive voltage applied to the emitter of such PNP type gating transistor by the voltage drop across the tunnel diode 14. As a result, very little base current flows in the gating transistor and such gating transistor does not take charging current away from the hold-off capacitor 58 which would impair the linearity of the hold-off signal and would necessitate the provision of the isolation amplifier referred to above. The width of the output pulse 52 may be controlled by moving the selector switch 52 to a hold-off capacitor 58 of the proper value, in order to vary the slope of the leading and trailing edges of the disabling signal 56. In addition, the setting of the variable resistor 66 in the current source also controls the width of the output pulse since it changes the charging resistance as well as the amount of charging current transmitted through transistor 62.

From the above it can be seen that the gating transistor 10 of the present invention operates in an extremely efficient manner due to the fact that such transistor is normally biased in a saturated conducting state and is driven only momentarily into the active conducting state by the receipt of an input trigger pulse 34 before it is immediately rendered nonconducting by the disabling signal 56 produced in response to the triggering of the tunnel diode by such trigger pulse. For this reason, substantially all of the current of the input trigger pulse is transmitted to the tunnel diode 14 so that such gating circuit may be employed even with trigger pulses of extremely low amplitude. At the same time, since a very small positive voltage is applied to the emitter of the gating transistor by the +.1 volt produced across the triggered tunnel diode, very little hold-off voltage is required to render such gating transistor nonconducting. Also it should be noted that even though the gating transistor 10 is normally biased in a saturated conducting state, very little of the bias current flowing through resistors 16 and 18 is diverted from the tunnel diode 14 and caused to flow through such gating transistor because the D.C. bias voltage applied between the emitter and collector of the transistor is only +.1 volt and such collector is connected to ground through the resistor 28 of 1 kilohm, which is extremely high impedance compared to the resistance of the tunnel diode. Of course, the setting of variable resistor 18 controls the amount of bias current flowing through the tunnel diode and is set slightly above the valley current of such tunnel diode to bias it in a high voltage stable state so that very little negative trigger current is required to trigger the tunnel diode to a low voltage stable state.

It will be obvious to those having ordinary skill in the art that various changes may be made in the details of the above described preferred embodiment of the present invention. For example, all of the transistors including the gating transistor 10 could be of the opposite type merely by reversing the polarity of the bias voltage and such gating transistor can be employed to control a transistor multivibrator rather than a tunnel diode, and in either case the multivibrator could be of a monostable type. Therefore, the scope of the present invention should only be determined by the following claim.

I claim:

A pulse generator circuit, comprising:

a tunnel diode;

means for connecting said diode as a multivibrator and for biasing said diode in a high voltage stable state;

a gating transistor having emitter, collector and base electrodes with said emitter connected to said diode;

means for forward biasing the emitter junction of said transistor with the voltage drop across said diode and for forward biasing the collector junction of said transistor to cause said transistor to be normally biased in a saturated conducting state;

means for applying trigger pulses to the collector of said transistor to trigger said diode to a low voltage stable state to produce an output pulse and to reduce the D.C. bias voltage applied to the emitter of the transistor to render said transistor nonconducting;

ramp generator means for generating a ramp voltage hold-off signal and for applying said hold-off signal to the base of said transistor to prevent said transistor from transmitting trigger pulses for a predetermined time after said diode is triggered, said ramp generator means including a plurality of different capacitors and a switch for selecting one of said capacitors to form said ramp voltage by charging the selected capacitor; and comparator means for comparing said ramp voltage with a D.C. reference voltage to produce a reverting pulse when said ramp voltage exceeds said reference voltage, and for applying said reverting pulse to said diode to revert said diode to a high voltage stable state and terminate said output pulse and for discharging the selected capacitor to cause said ramp voltage to return to its initial voltage while preventing the retriggering of said diode.

References Cited by the Examiner

UNITED STATES PATENTS

| | | | |
|---|---|---|---|
| 2,816,237 | 12/1957 | Hageman | 307—88.5 |
| 2,906,891 | 9/1959 | Scanlon | 307—88.5 |
| 3,017,613 | 1/1962 | Miller. | |
| 3,049,625 | 8/1962 | Brockman | 307—88.5 |
| 3,127,554 | 3/1964 | Kaneko. | |
| 3,138,764 | 7/1964 | Dalton et al. | |
| 3,171,977 | 3/1965 | Sharp | 307—88.5 |
| 3,191,069 | 6/1965 | Sampson | 307—88.5 |

FOREIGN PATENTS

| | | |
|---|---|---|
| 961,037 | 3/1957 | Germany. |

ARTHUR GAUSS, *Primary Examiner.*

I. C. EDELL, *Assistant Examiner.*